(12) United States Patent
Tanokuchi et al.

(10) Patent No.: US 7,554,798 B2
(45) Date of Patent: Jun. 30, 2009

(54) FLAT DISPLAY PANEL MODULE AND FLAT DISPLAY APPARATUS

(75) Inventors: Akito Tanokuchi, Yokohama (JP); Kuninori Suzuki, Chigasaki (JP); Kazuo Imaoka, Akashi (JP)

(73) Assignees: Hitachi, Ltd., Tokyo (JP); Fujitsu Hitachi Plasma Display Limited, Miyazaki-Ken (JP)

( * ) Notice: Subject to any disclaimer, the term of this patent is extended or adjusted under 35 U.S.C. 154(b) by 329 days.

(21) Appl. No.: 11/489,613

(22) Filed: Jul. 20, 2006

(65) Prior Publication Data

US 2007/0182877 A1     Aug. 9, 2007

(30) Foreign Application Priority Data

Jul. 22, 2005   (JP)   ............................ 2005-213200

(51) Int. Cl.
  *G06F 1/20*  (2006.01)
  *G02F 1/1333*  (2006.01)
(52) U.S. Cl. ..................... 361/679.21; 349/58
(58) Field of Classification Search ................ 361/681; 349/56, 57, 58, 59; 313/358, 582, 585
  See application file for complete search history.

(56) References Cited

U.S. PATENT DOCUMENTS

| | | | | |
|---|---|---|---|---|
| 5,432,626 A | * | 7/1995 | Sasuga et al. | 349/58 |
| 5,606,341 A | * | 2/1997 | Aguilera | 361/687 |
| 5,659,376 A | * | 8/1997 | Uehara et al. | 349/58 |
| 5,666,261 A | * | 9/1997 | Aguilera | 361/681 |
| 5,675,397 A | * | 10/1997 | Fukushima | 349/58 |
| 6,181,555 B1 | * | 1/2001 | Haley et al. | 361/681 |
| 6,288,489 B1 | * | 9/2001 | Isohata et al. | 313/582 |
| 6,366,264 B1 | * | 4/2002 | Kurumada | 349/58 |
| 6,373,702 B2 | * | 4/2002 | Oishi et al. | 361/703 |
| 6,494,429 B2 | * | 12/2002 | Tajima | 248/473 |
| 6,560,124 B1 | * | 5/2003 | Irie et al. | 361/682 |
| 6,654,232 B1 | * | 11/2003 | Tsao et al. | 349/58 |
| 6,744,186 B2 | * | 6/2004 | Oishi et al. | 313/573 |
| 6,859,357 B2 | * | 2/2005 | Morimoto et al. | 361/681 |
| 7,028,389 B2 | * | 4/2006 | Chang | 361/801 |
| 7,133,281 B2 | * | 11/2006 | Bae | 361/681 |
| 7,215,549 B2 | * | 5/2007 | Kim | 361/681 |

(Continued)

FOREIGN PATENT DOCUMENTS

JP     2001-324942     11/2001

(Continued)

*Primary Examiner*—Jayprakash N Gandhi
*Assistant Examiner*—Adrian S Wilson
(74) *Attorney, Agent, or Firm*—Antonelli, Terry, Stout & Kraus, LLP.

(57) ABSTRACT

A technique for improving impact resistance performance of a panel is provided in a module or display apparatus with a flat display panel. In a PDP module, a filter is bonded onto a front surface side of a PDP, and a base chassis is bonded to a rear surface side with a two-sided tape. In an attaching portion for the base chassis and a casing, a spring structure portion having a sloped portion and a space is provided in an area of the base chassis so as to correspond to a connecting part of the casing. Impact to glass of the PDP is buffered to an impact force in a direction vertical to a surface of the PDP due to a spring property of the spring structure portion.

15 Claims, 7 Drawing Sheets

U.S. PATENT DOCUMENTS

| | | | |
|---|---|---|---|
| 7,259,958 B2 * | 8/2007 | Bang et al. | 361/681 |
| 7,282,842 B2 * | 10/2007 | Kim et al. | 361/681 |
| 7,315,451 B2 * | 1/2008 | Kim et al. | 361/681 |
| 7,323,808 B2 * | 1/2008 | Kim et al. | 361/681 |
| 7,342,792 B2 * | 3/2008 | Kim et al. | 361/681 |
| 7,394,186 B2 * | 7/2008 | Kim | 361/681 |
| 2004/0034994 A1 * | 2/2004 | Chang | 29/760 |
| 2005/0052827 A1 * | 3/2005 | Kim | 361/638 |
| 2005/0212426 A1 * | 9/2005 | Ahn | 313/582 |
| 2005/0243106 A1 * | 11/2005 | Bae et al. | 361/728 |

FOREIGN PATENT DOCUMENTS

KR    2004-0035360    4/2004

* cited by examiner

FLAT DISPLAY PANEL MODULE AND FLAT DISPLAY APPARATUS

CROSS-REFERENCE TO RELATED APPLICATION

The present application claims priority from Japanese patent application No. JP 2005-213200 filed on Jul. 22, 2005, the content of which is hereby incorporated by reference into this application.

BACKGROUND OF THE INVENTION

The present invention relates to a module (hereinafter referred to as "FDP module") including a flat display panel (hereinafter referred to as "FDP") such as a plasma display panel (hereinafter referred to as "PDP"), and to a flat display apparatus (thin video display apparatus) such as a plasma display apparatus including the same module. It relates, more specifically, to a technique of a packaging structure and the like concerning impact resistance performance of an FDP (hereinafter simply referred to also as "panel").

In a plasma display apparatus, a PDP and a chassis serving as a base thereof (base chassis) are firmly fixed substantially entirely with an adhesive layer such as a two-sided tape, and configure a module (hereinafter referred to as a "PDP module") serving as a portion of the plasma display apparatus. The PDP module is attached to a plasma display apparatus casing depending on various kinds of types by assembly, whereby a display apparatus set is constituted. Accordingly, in the PDP module, a structure/portion (herein referred to as an "attaching portion") is provided for connecting and fixing the base chassis and the casing.

The PDP is constituted mainly as luminescent glass and, in general, glass is weak in impact. For example, if an external force is applied to a front surface of the panel of the PDP, the panel may be broken due to the impact therefrom. Further, requirement for reducing costs of the PDP is very high, and it is required to enhance long-term reliability including prevention of breakage of the panel.

An example of a technique for improving the impact resistance performance of the panel is described in Patent Document 1 (Japanese Patent Laid-open Publication No. 2001-324942). This technique discloses that impact is distributed by providing a void to a fixing portion for fixing the chassis (plate) to the casing.

SUMMARY OF THE INVENTION

In the PDP module, for example, the impact from the front surface of the panel of the PDP is directly transmitted to the luminescent glass, so that it is necessary to improve the impact resistance performance more than ever before for the prevention of breakage of the panel.

Especially, in the vicinity of the attaching portion to the casing in the base chassis fixing a panel surface, a rear surface side of the luminescent glass is pressed and fixed by a structure of the attaching portion. Therefore, it is difficult to make a force transmitted to the luminescent glass in the vicinity of the attaching portion escape. That is, a problem is such that the impact resistance performance in the vicinity of the attaching portion is inferior to that in the vicinity of an area where the attaching portion does not exist, which results in a possibility that the panel will be broken.

Note that, in the technical described in Patent Document 1, at a convex portion forming a space between the panel and the chassis in response to the attaching portion (fixing portion) to the apparatus casing (base substrate), a force applied to the panel is distributed from the casing side via a convex-portion side surface (side wall). However, the convex-portion side surface is at a right angle with the chassis surface. Therefore, the force applied to a direction vertical to the surface of the panel is applied to a portion of the convex-portion side surface as it is. Further, the convex portion has no spring property.

The present invention has been made in consideration of the above problem, and accordingly an object of the present invention is to provide a technique for effectively buffering, absorbing, or distributing a force applied to the panel of an FDP module, especially a stress concentrating locally in the vicinity of the attaching portion of the base chassis and the casing, thereby improving impact resistance performance of the panel and enhancing long-term reliability thereof.

Outlines of representative ones of the inventions disclosed in the present application will be briefly described as follows. In order to achieve the above object, each of the FDP module and the flat display apparatus with the same according to the present invention includes the FDP, the base chassis for fixing the FDP, and the attaching portion for the base chassis and the casing, and has the following features.

An FDP module according to the present invention has a FDP constituted so as to include mainly luminescent glass, and a base chassis fixed closely to the FDP with an adhesive layer (for example, a two-sided tape) or the like. A rear surface side of the base chassis has an attaching portion that includes a structure or part for attaching a flat display apparatus casing to the FDP module. And, as means for buffering, absorbing, or distributing a force applied to the FDP, an elastic (or spring) structure portion is provided to the attaching portion. The force applied to the FDP is, for example, an impact force occurring due to an external force from the front surface of the FDP and is transmitted via the FDP, the base chassis, the attaching portion, the casing, and the like, and is a stress concentrating on the glass of the FDP in the vicinity of the attaching portion especially in a direction vertical to the surface of the FDP. More detailed descriptions will be made in the following items (1) to (5) and the like.

(1) In this FDP module, the base chassis is constituted so as to include a metal plane plate. The elastic structure portion of the attaching portion is formed in a portion (partial area) of the plane plate of the base chassis. A cross section in the direction vertical to the surface of the FDP in the elastic structure portion is constituted so as to have a sloped portion and be formed into a raised shape or floated shape on a rear surface side of the FDP. Further, a cross section of a portion of the base chassis in the elastic structure portion is, for example, a substantially trapezoidal shape and is a shape that has a void (namely containing air) along with the FDP. The shape concerned may be called also a plane-bent shape, a curved shape, or the like. The angle formed between the sloped portion and the plane of the base chassis is set other than 90 degrees, for example, within a range from 5 degrees or more to 60 degrees or less, whereby appropriate elasticity is ensured.

(2) Further, as the elastic structure portion, a spring member or impact absorbing member is used. For example, the attaching portion has a portion of the base chassis, a portion of the casing, and a connecting part for connecting and fixing the portions of the base chassis and the casing. And, between the portion of the base chassis and the connecting part, the spring member with elasticity mainly in the direction vertical to the surface of the FDP or the like is connected and fixed.

(3) Furthermore, the elastic structure portion of the attaching portion has a filling material with higher thermal conductivity than that of air, for example, has a gel material in the void between the surface of the portion of the base chassis (including the sloped portion, a fixed surface of the connecting part, and the like) and the FDP or a surface of an adhesive layer. Thereby, both of the impact resistance performance and the heat dissipation performance are attained.

(4) Moreover, a front surface side of the FDP has a filter or impact absorbing layer with an impact absorbing property mainly in the direction vertical to the surface of the FDP. To the force applied to the FDP, the elastic structure portion and the filter work synergistically for the impact resistance performance.

(5) Further, the elastic structure portion of the attaching portion is formed by, for example, pressing a portion corresponding to a plane of a metal plate constituting the base chassis.

Furthermore, as another structure, for example, the present FDP module has the attaching portions so as to correspond to a plurality of portions in a rear surface of the base chassis, and the elastic structure portion is provided to each of a plurality of the attaching portions.

Moreover, the attaching portion has a connecting part for connecting and fixing a portion of the base chassis and a portion of the casing, and an upper surface of the elastic structure portion formed in the portion of the base chassis and a lower surface of the connecting part are connected and fixed by screwing or the like.

Further, the attaching portion is such that two elastic structure portions formed in the portion of the base chassis are formed as a pair, a bridge-shaped connecting part is fixed to an area of the pair, a beam-shaped part is fixed to an area including a plurality of the connecting parts, and the casing, a circuit portion and the like are fixed to a portion of the beam shaped.

Furthermore, the elastic structure portion of the attaching portion is made of, for example, aluminum if its heat dissipation performance is emphasized. Further, the elastic structure portion of the attaching portion is made of, for example, iron if its costs are emphasized.

Moreover, in the above-mentioned FDP module, the FDP is a PDP that includes a front surface substrate and a rear surface substrate are mainly made of glass. A plasma display apparatus is constituted so as to include this PDP module and the casing.

Further, in a flat display apparatus constituted so as to have the FDP module as described above, a base chassis side and the flat display apparatus casing (an external case or the like) are connected and fixed to the attaching portion via the connecting part or the like.

Furthermore, in another FDP module, the connection part is constituted so as to include the elastic structure portion or spring part on a side adjacent to the portion of the base chassis, a side adjacent to the portion of the casing, and/or the like.

Effects obtained from the representative ones of the inventions disclosed in the present application will be briefly explained as follows. According to the present invention, since the force applied to the panel of the FDP module is effectively buffered, absorbed, or distributed, it is possible to improve the impact resistance performance of the panel and prevent breakage of the glass or the like to increase long-term reliability of the FDP.

Further, according to items (3) and the like as described above, both of the impact resistance performance and the heat dissipation performance of the panel can be attained. Also especially, according to items (4) and the like as described above, the impact resistance performance can be enhanced by a synergetic effect with the filter. Moreover, especially, according to items (5) and the like, an elastic structure can be realized without involving an increase in the number of parts and by increasing no costs or very slightly costs.

DESCRIPTION OF THE PREFERRED EMBODIMENTS

Figure 1:
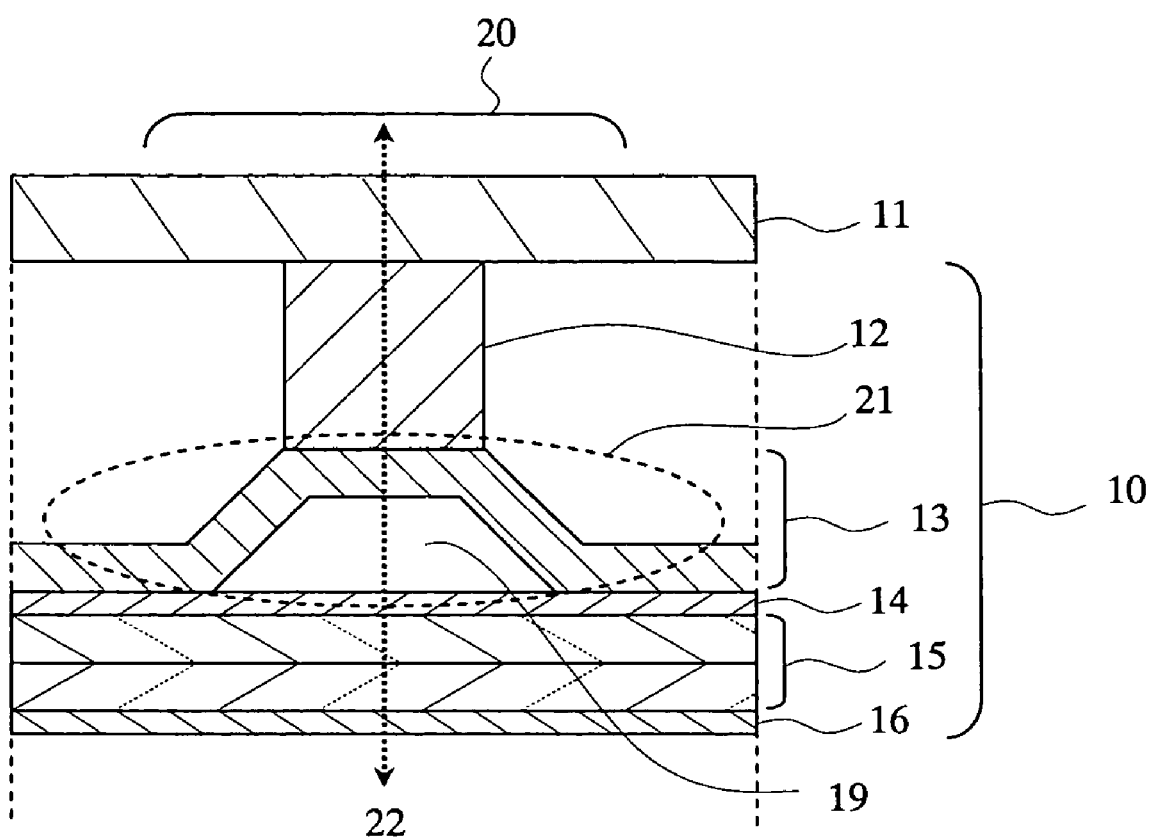
FIG. 1 is a view showing a cross-sectional structure in the vicinity of an attaching portion for a PDP module and a casing in a plasma display apparatus according to a first embodiment of the present invention.

Embodiments according to the present invention will be detailed below with reference to the drawings. Note that, throughout all the drawings for explaining the embodiments, the same components are denoted in principle by the same reference numerals and repetitive explanations thereof will be omitted. FIGS. 1 to 8 are views for explaining the embodiments according to the present invention.

First Embodiment

A first embodiment provides a structure including an FDP module and a PDP serving as a flat display apparatus, wherein the embodiment has, as an outline, a dish-shaped spring structure portion in a base chassis area corresponding to an attaching portion for a PDP module and a plasma display apparatus casing.

Figure 2:
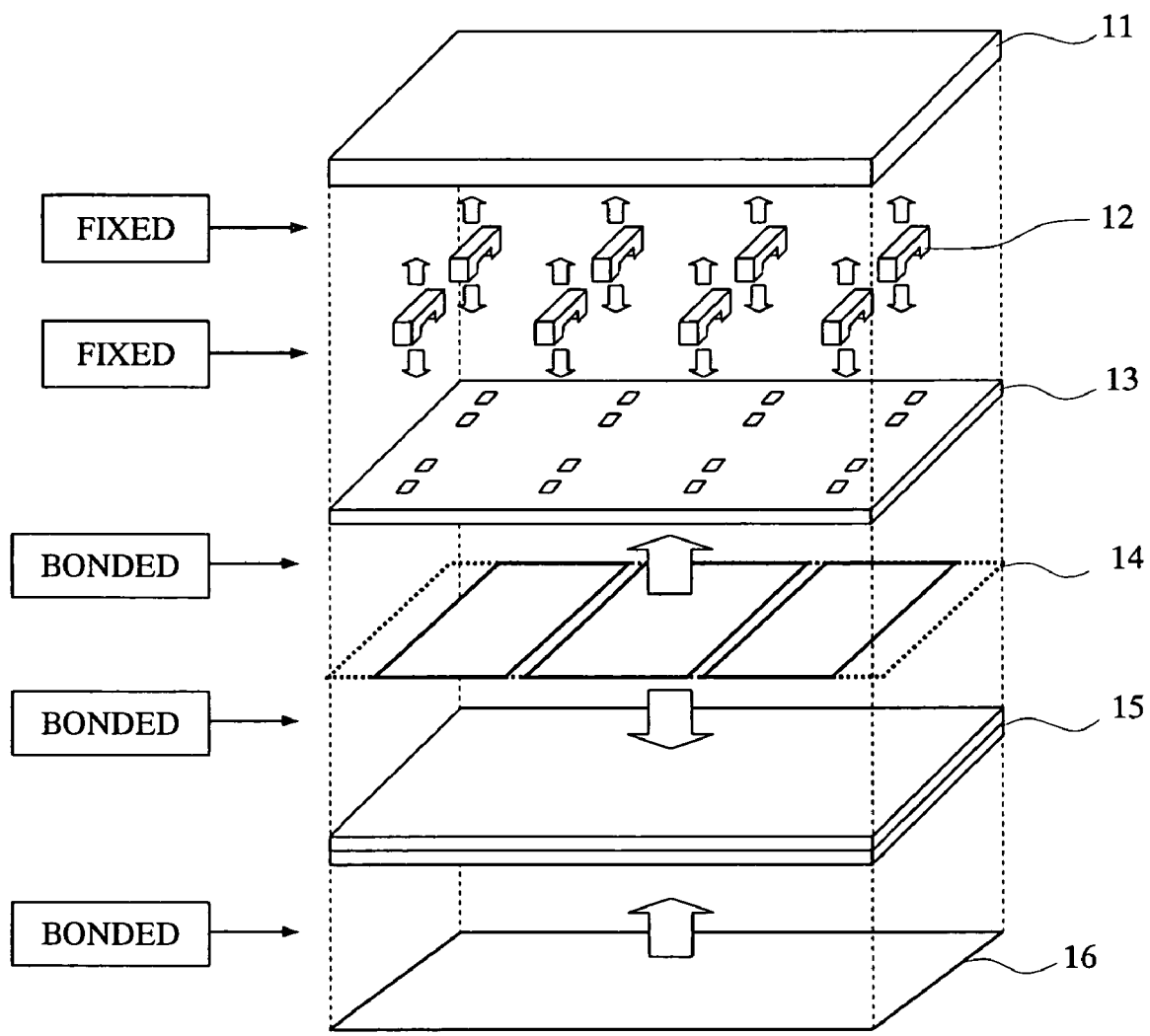
FIG. 2 is a perspective view showing a disassembled structure in manufacture of the PDP module and in assembly of the PDP module and the casing in the plasma display apparatus according to the first embodiment of the present invention.
Figure 3:
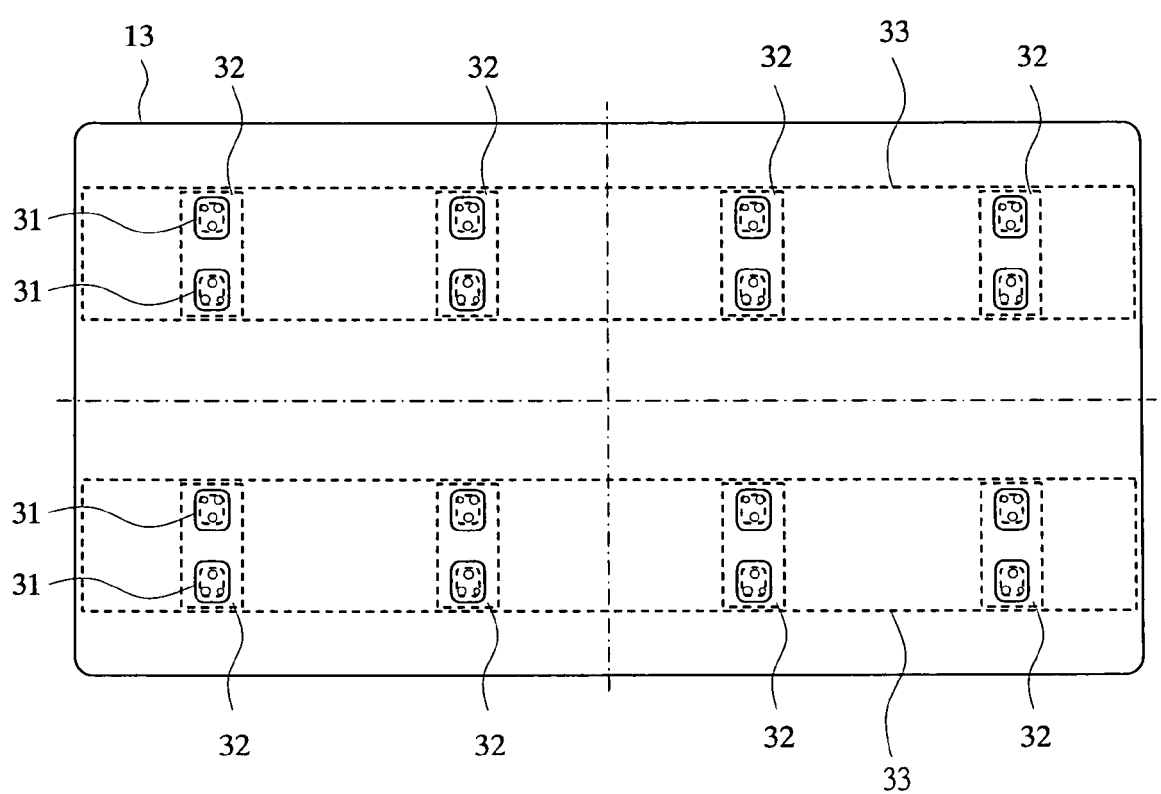
FIG. 3 is a plan view showing a structure of an attaching area in a rear surface of a base chassis of the PDP module in the plasma display apparatus according to the first embodiment of the present invention.
Figure 4:
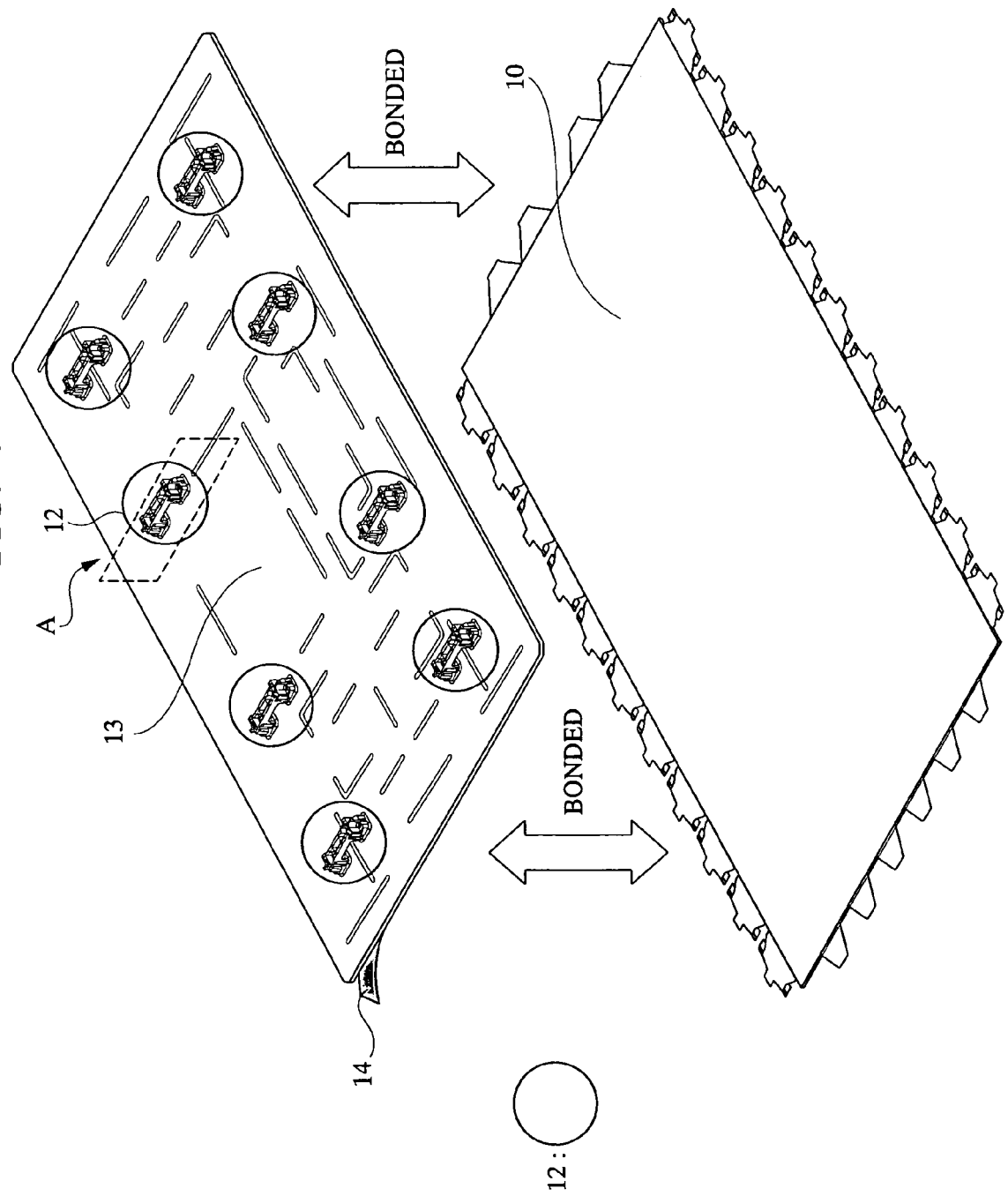
FIG. 4 is a perspective view showing a bonding structure of a PDP and the base chassis in the plasma display apparatus according to the first embodiment of the present invention.
Figure 5:
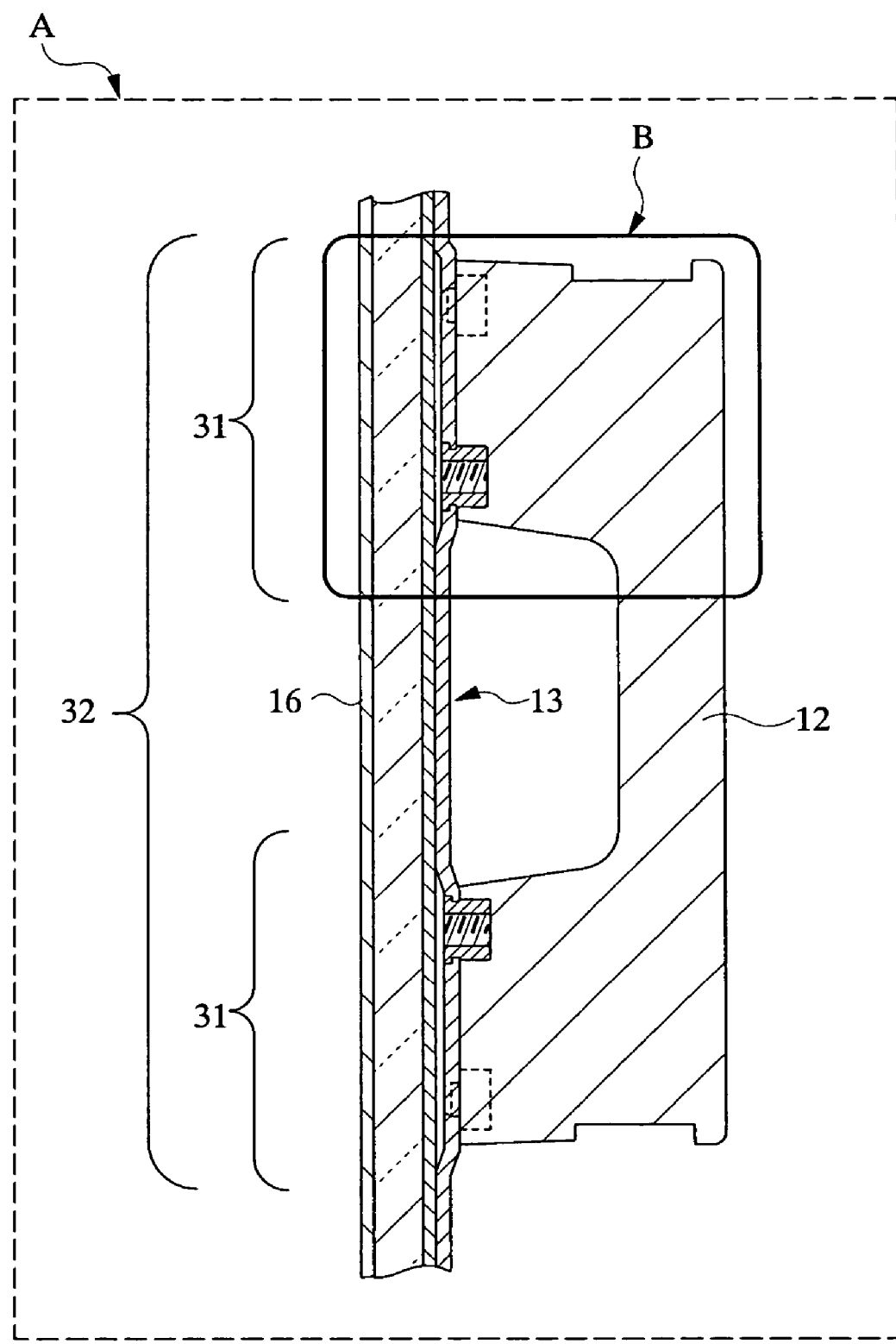
FIG. 5 is a view showing a cross-sectional structure of an attaching area of a connecting part of the PDP module in the plasma display apparatus according to the first embodiment of the present invention.
Figure 6:
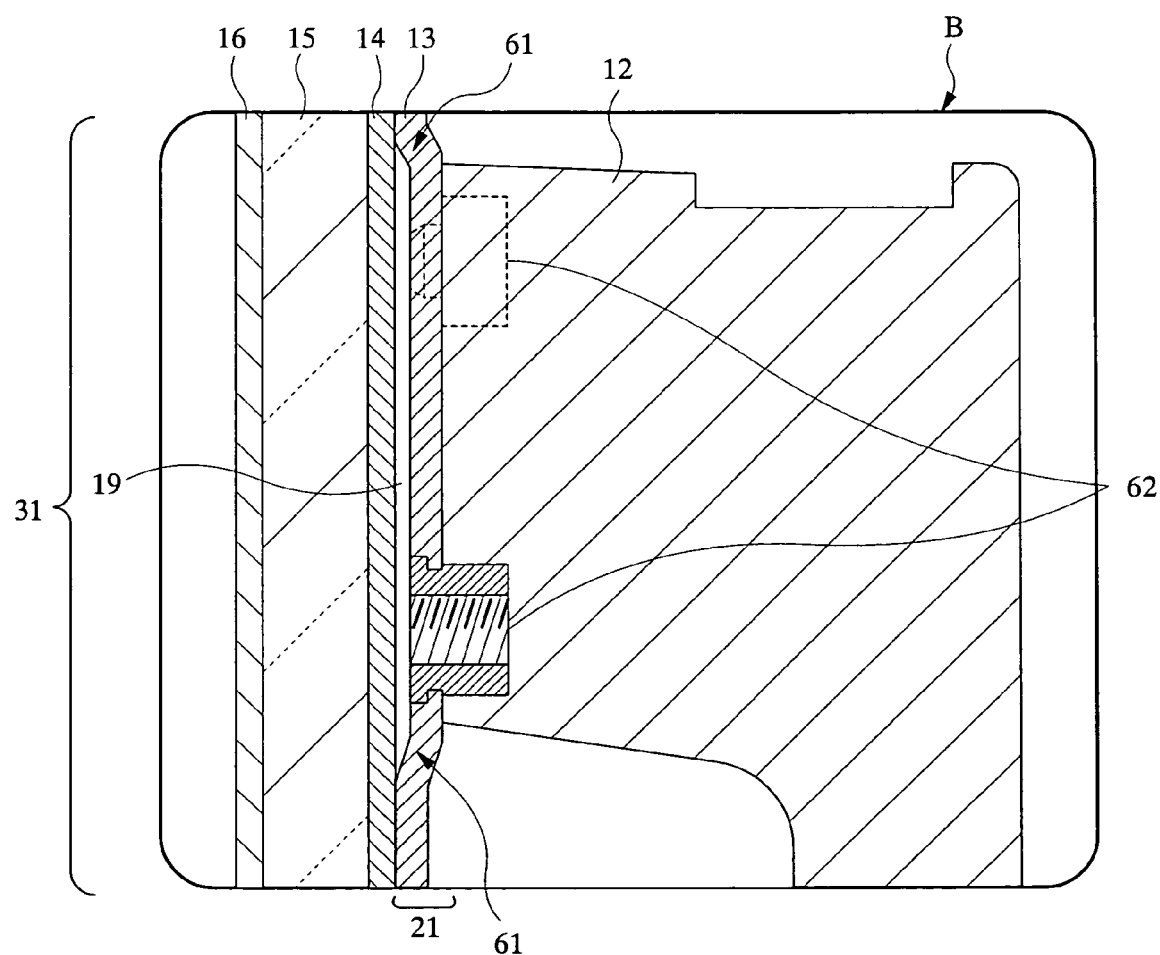
FIG. 6 is a view showing a detail of a cross section of an area of a spring structure portion of the PDP module in the plasma display apparatus according to the first embodiment of the present invention.

FIG. 1 through FIG. 6 show structures of a PDP module (10) and a plasma display apparatus according to the first embodiment of the present invention. FIG. 1 shows a main structure of this plasma display apparatus and illustrates a cross-sectional structure in the vicinity of an attaching portion (20) for the PDP module (10) and the casing (11). FIG. 2 shows a disassembled structure in assembly (manufacture) of the PDP module (10) and in assembly of the PDP module (10) and the casing (11). FIG. 3 shows a structure of an attaching area of a rear surface of a base chassis (13) in the PDP module (10). FIG. 4 shows a structure for bonding a PDP (15) and the base chassis (13) on each other and a structure for attaching a connecting part (12) to the rear surface of the base chassis (13). FIG. 5 shows a cross-sectional structure in an attaching area of a connecting part (12) of the PDP module (10). FIG. 6 shows a detail of a cross section of an area of a spring structure portion (21) in the PDP module (10).

In FIG. 1, a PDP module 10 is attached to a casing 11 by one or more attaching portions 20, whereby a product (set) of a plasma display apparatus is constituted. The PDP module 10 has, subsequently from a front surface side thereof, a filter (directly bonded filter) 16, a PDP 15, a two-sided tape 14, a base chassis 13, and a casing connecting part (referred to as a "connecting part") 12. An area corresponding to the attaching portion 20 in the base chassis 13 is provided with a spring structure portion (disk spring structure portion) 21. The spring structure portion 21 has a space (void) 19 on a side of the PDP 15. The arrows in Figure represent a center axis 22 of the attaching portion 20 or the spring structure portion 21, and show the line indicating propagation of a force in a direction vertical to a surface of the PDP 15.

In FIG. 2, the PDP module 10 is mainly constituted by the PDP 15 and the base chassis 13. The entire rear surface of the PDP 15 is bonded mutually to a front surface of the base chassis 13 with one or more sheet of two-sided tape 14. Further, to the entire front surface of the PDP 15, a filter 16 is bonded directly.

Further, a rear surface side of the base chassis 13 and the casing 11 are connected and fixed to the connecting parts 12 via the spring structure portions 21 on the base chassis 13. In this embodiment, they are attached by eight connecting parts 12 using 16 (sixteen) areas (corresponding to the spring structure portions 21) on a surface of the base chassis 13 corresponding to a surface of the PDP 15.

The PDP module 10 has, as other elements, a circuit unit for driving and controlling the PDP 15, a group of electrodes of the PDP 15, a driver module connected to the circuit unit, and the like. The driver module is a module in which a driver IC chip is packaged on a flexible board.

In FIG. 1 and FIG. 2, the casing 11 is a structure body corresponding to an external case of the plasma display apparatus and is made of, for example, metal. In addition, although the casing 11 is illustrated in a plane-plate shape for convenience, a structure body comprising various kinds of detailed shapes or a plurality of parts can be employed in practice.

The PDP 15 has a substantially two-layer structure comprising a front-surface board and a rear-surface board, and is mainly constituted by luminescent glass. In the PDP 15, a group of electrodes, a dielectric layer, a protective layer, barrier ribs, a phosphor layer, and the like not illustrated are formed with respect to a substrate. Among components of the PDP 15, the impact resistance performance of glass is lowest in general.

The base chassis 13 is a base holding and fixing the PDP 15, the circuit unit, and the like constituting the PDP module 10, and is mainly constituted by a metal plate with a single-plate structure made of, for example, an aluminum material or the like. The base chassis 13 has a surface enough large to be able to fix at least a surface of the PDP 15.

The connecting parts 12 are each made of, for example, plastic, and are fixed to the base chassis 13 and the casing 11 by screwing or the like. The connecting part 12 may be referred to as a "spacer" or the like.

The filter 16 is a directly bonded filter made of a polymer film and having optical transparency and an impact absorbing property with respect to the PDP 15. The impact absorbing property of the filter 16 works synergistically with the impact absorbing property of the spring structure portion 21. The filter 16 may have an optical characteristic for adjusting and improving the light emission of the PDP 15, or be provided by overlapping the filters and the like having such optical characteristics.

The two-sided tape 14 is a resin tape or the like in which adhesive is applied to both surfaces for serving as adhesive layers. Further, if having not only an adhesive function but also flexibility, the two-sided tape 14 becomes further effective for impact resistance performance.

The two-sided tape 14, the base chassis 13, and the like also have thermal conductivity and heat generated in the PDP 15, the circuit unit, and the like is dissipated also to the outside via the two-sided tape 14, the base chassis, and the like.

In FIG. 1, the attaching portion 20 is provided between the rear surface of the base chassis 13 and the casing 11. The attaching portion 20 is a portion shown separately for convenience of explanation. The attaching portion 20 includes the spring structure portion 21 as a portion of the case chassis 13, the connecting part 12, an area of a portion of the casing 11, a screwing structure and a part for connecting and fixing other components, and the like. In the attaching portion 20, the surface of the spring structure portion 21 of the base chassis 13 and the surface of the casing 11 are connected and fixed to upper and lower surfaces of the connecting part 12, respectively. Connection and fixation of the upper and lower surfaces of the connecting part 12 are carried out by, for example, screwing. In concrete, as shown in FIG. 2 and the like, in consideration of attaching performance and the like, a plurality of attaching portions 20 are provided in an area of a surface corresponding to the surfaces of the PDP 15 and the base chassis 13.

In FIG. 3, the present embodiment has, as areas concerning the attaching portion 20, 16 (sixteen) first areas 31 corresponding to the spring structure portions 21 in the rear surface of the base chassis 13. The first area 31 is a portion raised in an island shape on a side of the rear surface of the base chassis 13 (an area bent into a substantially trapezoidal shape in the cross section shown in FIG. 1), and is an area serving as a unit for being connected and fixed to the casing 11. The shape of the first area 31 is roughly quadrangular when viewed from the side of the rear surface of the base chassis 13, but other shapes thereof may be also used. Further, in order to connect and fix the connecting parts 12, the rear surface of the base chassis 13 has 8 (eight) second areas 32, each of which makes two first areas 31 into a pair. The detailed shape of the connecting part 12 in FIG. 1 is a bridge shape as shown in FIG. 5 and the like, and is fixed to the second area 32. Further, to connect and fix the casing 11 to the connecting part 12, the rear surface of the base chassis 13 has 2 (two) band-shaped third areas 33 each including 4 (four) second areas 32 vertically. To upper surfaces of the plurality of connecting parts 12 in the third area 33, beam-shaped parts are for example connected and fixed, whereby the casing 11, unshown other circuit units, and the like are connected and fixed via the beam-shaped parts. The packaging structure of the connecting parts 12 and the like as described above is an example, and other packaging structures based on the structure shown in FIG. 1 may be adopted.

In FIG. 4, details of the packaging structure of the PDP 15 and the base chassis 13 are shown. The rear surface of the PDP 15 and the front surface of the base chassis 13 are bonded to each other with the two-sided tape 14. An end of the PDP 15 is connected to an unshown driver module for driving the group of electrodes. The base chassis 13 is connected and fixed to the connecting parts 12 by screwing in the respective areas (second areas 32) on the rear surface side as shown in FIG. 3. The reference symbol "A" is an example of the cross section of the attaching portion 20 in the PDP module 10 including the connecting part 12. In the substantially plane-plate shape of the base chassis 13, the height of the plurality of first areas 31 is the same as that of the connecting parts 12.

In FIG. 1, the spring structure portion 21 has a sloped portion having an angle to a plane of the base chassis 13 (non-attaching portion area), a plane for fixing the connecting part 12, and a space 19 between the PDP 15 and the two-sided tape 14. The spring structure portion 21 has a spring property in a direction of the center axis 22 of the attaching portion 20 due to a shape and a material of the spring structure portion including the sloped portion. That is, by this spring property, the spring structure portion has a function for buffering, absorbing, and distributing an impact force in the direction of the center axis 22. The angle between the sloped portion of the spring structure portion 21 and the plane of the base chassis 13 is an angle other than 90 degrees. Note that the cross section of the spring structure portion 21 is shown as a substantially trapezoidal shape comprising a plurality of planes, but a smooth curved shape or the like may be used so long as it has a spring property.

In the cross section "A" in FIG. 5, each of two first areas 31 in the second area 32 has the attaching portion 20 with the spring structure portion 21. The reference symbol "B" is an example of a cross section corresponding to one spring structure portion 21 of the attaching portion 20. The cross section of the connecting part 12 is a bridge shape, and a lower surface thereof is connected and fixed to an upper surface of the spring structure portion 21 in the base chassis 13.

In the cross section "B" in FIG. 6, the spring structure portion 21 has a sloped portion 61. The angle between the sloped portion 61 and a non-attaching area plane of the base chassis 13 (or a surface of the PDP 15 or two-sided tape 14) is approximately 8 degrees in this embodiment. This angle is designed within a range from 5 degrees or more to 60 degrees or less. Thereby, it is possible to ensure the spring property of the spring structure portion 21, maintain flatness of a portion other than the spring structure portion 21 in the base chassis 13 with the single-plate structure, and sufficiently attain adhesiveness by the two-sided tape 14. Further, a fixing surface of the spring structure portion 21 to the connecting part 12 and a lower surface of the connecting part 12 are provided with screwing portions 62 and fixed by screwing.

The spring structure portion 21 is formed by pressing and processing, from a front surface side, an aluminum plane plate constituting a portion of the base chassis 13 for obtaining a shape corresponding to that of the space 19. In the case of such a manufacturing method, since no part is newly provided for realizing the function of the spring property, it is possible to realize low costs without increasing the number of steps needed for assembly work.

In such a structure as above, since the spring structure portion 21 and the filter 16 work in the direction of the center axis 22 of the attaching portion 20, it is possible to ease the impact force transmitted to the glass of the PDP 15 especially in the vicinity of the attaching portion 20.

In the conventional technique, the rear surface side of the glass of the PDP is directly pressed, supported, and fixed by the parts constituting the attaching portion in an area located in the vicinity of the attaching portion of the PDP module and the casing. Therefore, when an external force is applied to the glass of the PDP, a stress concentrates and has a great influence on the glass located in the vicinity of the attaching portion. Further, in the non-attaching portion area other than the area in the vicinity of the attaching portion, the force transmitted through the glass of the PDP is attenuated due to deflection and the like of a panel surface, so that the impact resistance performance in the area located in the vicinity of the attaching portion is relatively weak.

On the other hand, in the first embodiment, the glass and the like of the PDP 15 in the area located in the vicinity of the attaching portion 20 are not merely pressed by the connecting part 12 but also pressed via the spring structure portion 21. Therefore, for example, when an external force is applied from the front surface of the PDP 15, the impact force transmitting the glass of the PDP 15 (stress concentrating in the vicinity of the connecting part 12) in the direction of the center axis 22 of the attaching portion 20 is buffered, absorbed, and distributed by the spring structure portion 21 (and the filter 16). That is, the impact resistance performance in the area located in the vicinity of the attaching portion 20 is improved and, especially, the impact force to the glass of the PDP 15 is also suppressed. As a result, breakage of the glass and the like can be also prevented.

Further, in the present embodiment, the filter 16 with an impact absorbing property is provided on the front surface of the PDP 15 in addition to the spring structure portion 21, so that the buffering, absorbing, and distributing functions work synergistically with respect to the impact force transmitted to the glass of the PDP 15 due to these two components. For this reason, it is possible to obtain a synergy effect in an impact resistance performance as compared with the case of not providing the filter 16.

Note that, in order to attach the PDP module 10 and the casing 11, the present embodiment may include a part or structure other than the connecting part 12. Further, in this embodiment, the connecting part 12 is included as a portion of the PDP module 10. However, the connecting part may be a separate part not included as a portion of the PDP module 10 or be a part provided on a side of the casing 11. Furthermore, in place of a separate part, the connecting part 12 may have a structure incorporated integrally in the base chassis 13, the casing 11, or the like. Moreover, for example, the spring structure portion 21 may be manufactured as a part other than the base chassis 13, or may be connected and fixed to the area in the plane of the base chassis 13.

Further, a raw material of the spring structure portion 21 includes, in addition to aluminum, metal such as iron, thereby making it possible to realize desired elasticity. Furthermore, in consideration of not merely elasticity but also a balance of heat dissipation performance and cost, the raw material may be selected. Moreover, when the plurality of attaching portions 20 are provided, some of the attaching portions may have the spring structure portions 21 and the remaining ones may have no spring structure portions.

Second Embodiment

Figure 7:
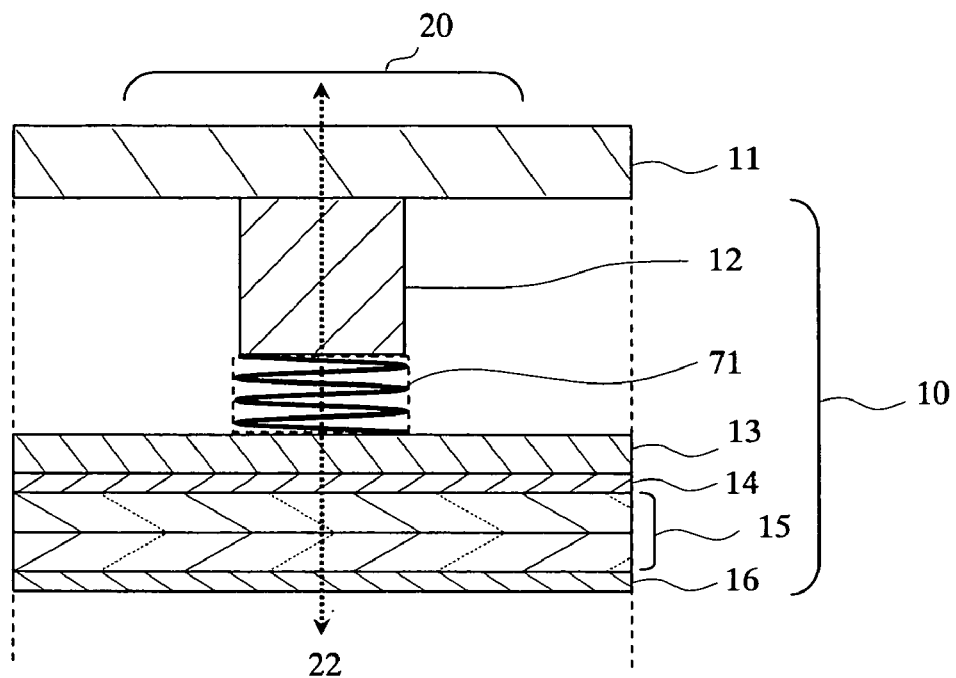
FIG. 7 is a view showing a cross-sectional structure in the vicinity of an attaching portion for a PDP module and a casing in a plasma display apparatus according to a second embodiment of the present invention.

Next, a second embodiment will be explained. FIG. 7 shows a structure of a PDP module and a plasma display apparatus according to a second embodiment of the present invention. The second embodiment has a structure as a portion corresponding to a spring structure portion 21 in the above-mentioned attaching part 20, that is, a structure in which a spring part 71 is connected and fixed between the base chassis 13 and the connecting part 12. The other structures in the second embodiment are the same as those in the first embodiment. In the first embodiment, the spring structure portion 21 is formed as a portion of the structure body of the base chassis 13. However, the second embodiment has a structure providing directly and interposing the spring part 71.

The spring part 71 has elasticity in the direction of the center axis 22, that is, may be called an impact absorbing material. The spring part 71 may be more particularly constituted from various kinds of structures. Regarding the attaching portion 20, the lower surface side of the spring part 71 is connected and fixed to the plane of the base chassis 13, and the lower surface of the connecting part 12 is connected and fixed to the upper surface side of the spring part 71.

Similarly to the structure of the second embodiment, the impact force transmitted to the glass of the PDP 15 and the like in the direction of the center axis 22 is buffered by the functions of the spring part 71 and the filter 16, so that the impact resistance performance can be improved.

Third Embodiment

Figure 8:
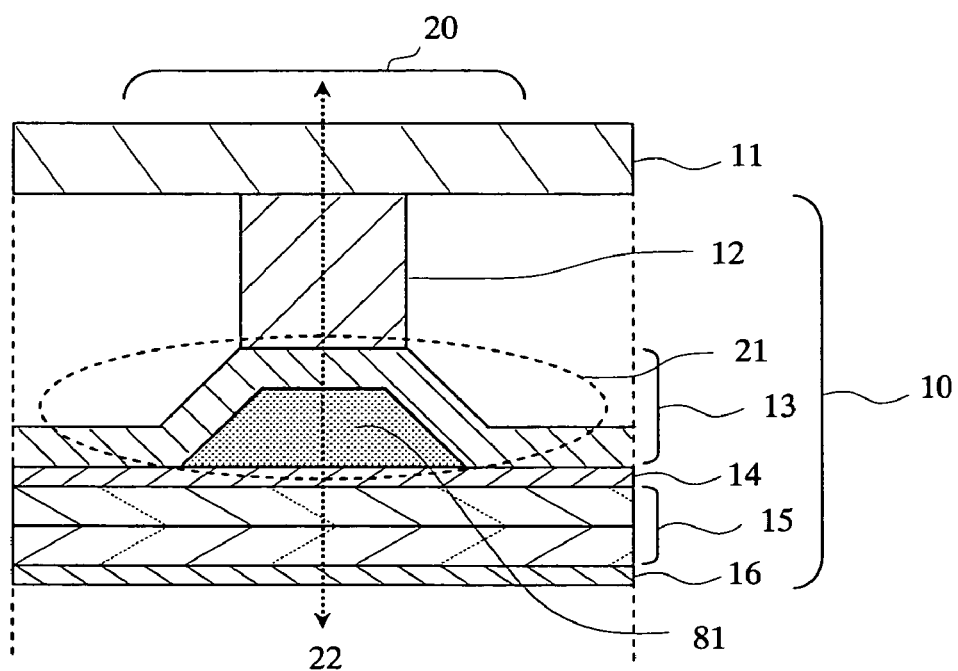
FIG. 8 is a view showing a cross-sectional structure in the vicinity of an attaching portion for a PDP module and a casing in a plasma display apparatus according to a third embodiment of the present invention.

Next, a third embodiment will be explained. FIG. 8 shows a structure of a PDP module and a plasma display apparatus according to a third embodiment of the present invention. The third embodiment further has a constitution in the attaching portion 20 with the same structure as that in the first embodiment, that is, a constitution in which a filling material (highly thermal conductive gel material) 81 is provided in the space 19 in the spring structure portion 21 to attain both of impact resistance performance and heat dissipation performance. The other constitutions in the third embodiment are the same as those in the first embodiment.

The filling material 81 is a gel material, liquid, or the like that has a high thermal conductivity at least as compared with air. In the case where air exists in the space 19 in the first embodiment, since heat thermal conductivity of air is low, the heat dissipation performance of the attaching portion 20 is slightly inferior. However, in the third embodiment, since the space is filled with the filling material 81, the heat dissipation performance of the attaching portion 20 can be improved.

Note that, if the space 19 of the spring structure portion 21 is sufficiently small and especially has no problem of heat dissipating performance, no need to provide the filling material 81 arises in particular. If the space 19 is large, the heat dissipation performance becomes disadvantageous for such a large space. Therefore, the disadvantage is solved by providing the filling material 81. Further, as occasion demands, the filling material 81 may be provided partially in the space 19.

With regard to the respective embodiments as described above, the following structures may be also adopted. First, even if a structure in which the filter 16 with an impact absorbing property is not provided is adopted, the impact resistance performance can be improved due to elastic portions (21 and 71). Further, the present invention is not limited to the structure in which the elastic portions are provided in the area on the surface of the base chassis 13 or/and between the surface of the base chassis 13 and the connecting part 12, and may have a structure in the direction of the center axis 22 in the area of the attaching portion 20, for example, a structure in which the same elastic portions are provided on the connecting part 12 itself, in the area itself of the casing 11, or between the connecting part 12 and the casing 11. Also in this case, the same effects as those in the above-mentioned embodiments can be obtained.

As described above, the inventions made by the present inventors have been explained based on the embodiments. However, the present invention is not limited to the above embodiments and, needless to say, may be variously modified within the scope of not departing from the gist thereof.

The present invention may be applied to a module, an apparatus, or the like with a panel or the like that requires impact resistance performance.

What is claimed is:

1. A flat display panel module comprising:
a flat display panel including glass; and
a base chassis fixed closely to a surface of the flat display panel;
wherein the base chassis includes a metal plane plate;
wherein a portion of the plane plate of the base chassis is formed into a raised shape extending from the plane of the plane plate and having a sloped portion with respect to other portions of the plane plate of the base chassis, and an attaching portion is connected at an upper surface of the raised shape for attachment with another portion of the flat display panel module and wherein an area of the raised shape having the sloped portion has, in a space between a surface of the base chassis and a surface of the flat display panel, a gel filling material with thermal conductivity higher than that of air.

2. The flat display panel module according to claim 1, wherein the raised shaped having the sloped portion has a substantially trapezoidal shape cross section and is formed into a shape having a void with the flat display panel.

3. The flat display panel module according to claim 1, wherein the raised shape having the sloped portion has an angle formed between the plane plate and the sloped portion which is set within a range from 5 degrees to 60 degrees.

4. The flat display panel module according to claim 1, wherein a front surface side of the flat display panel has a filter with an impact absorbing property in a direction vertical to a surface of the flat display panel.

5. The flat display panel module according to claim 1, wherein raised shape having the sloped portion is formed by pressing a portion of the plane plate of the base chassis.

6. The flat display panel module according to claim 1, further comprising a casing and a connecting part for connecting and fixing portions of the base chassis and the casing; wherein an upper surface of the raised shape having the sloped portion and a lower surface of the connecting part are connected and fixed by screwing.

7. The flat display panel module according to claim 1, wherein the base chassis is made of aluminum.

8. The flat display panel module according to claim 1, wherein the base chassis is made of iron.

9. The flat display panel module according to claim 1, wherein the flat display panel is a plasma display panel including a front surface substrate and a rear surface substrate containing glass.

10. A flat display apparatus comprising:
a flat display panel module including:
a flat display panel including glass; and
a base chassis fixed closely to a surface of the flat display panel; and
a casing for containing the flat display panel module;
wherein the base chassis includes a metal plane plate;
wherein the base chassis includes a plurality of structure portions, each of the structure portions include a portion of the plane plate of the base chassis formed into a raised shape extending from the plane of the plane plate and having a sloped portion with respect to other portions of the plane plate of the base chassis, two of the structure portions being formed as a pair, and a bridge-shaped connecting part being connected to the pair of structure portions;
wherein the casing is connected and fixed to the bridge-shaped connecting part, and the base chassis and the casing are fixed and wherein an area of the raised shape having the sloped portion has, in a space between a surface of the base chassis and a surface of the flat display panel, a gel filling material with thermal conductivity higher than air.

11. The flat display apparatus according to claim 10, wherein a front surface side of the flat display panel has a filter with an impact absorbing property in a direction vertical to a surface of the flat display panel.

12. The flat display apparatus according to claim 10, wherein the raised shape having the sloped portion is formed by pressing a portion of the plane plate of the base chassis.

13. The flat display apparatus according to claim 1, wherein the base chassis has the raised shape having the sloped portion in each of a plurality of areas, and wherein a portion of the raised shape having the sloped portion in each of the plurality of areas is connected by the part connected to the attaching portion.

14. The flat display apparatus according to claim 1, wherein the sloped portion has an angle formed between the plane plate and the sloped portion which is set at an angle other than 90 degrees.

15. The flat display apparatus according to claim 10, wherein the sloped portion has an angle formed between the plane plate and the sloped portion which is set at an angle other than 90 degrees.

* * * * *